(12) United States Patent  
Huber

(10) Patent No.: US 11,086,055 B2
(45) Date of Patent: Aug. 10, 2021

(54) MIRROR, IN PARTICULAR FOR A MICROLITHOGRAPHIC PROJECTION EXPOSURE APPARATUS OR AN INSPECTION SYSTEM

(71) Applicant: Carl Zeiss SMT GmbH, Oberkochen (DE)

(72) Inventor: Peter Huber, Heidenheim (DE)

(73) Assignee: CARL ZEISS SMT GMBH, Oberkochen (DE)

(*) Notice: Subject to any disclaimer, the term of this patent is extended or adjusted under 35 U.S.C. 154(b) by 147 days.

(21) Appl. No.: 16/514,006

(22) Filed: Jul. 17, 2019

(65) Prior Publication Data

US 2019/0339428 A1 Nov. 7, 2019

Related U.S. Application Data

(63) Continuation of application No. PCT/EP2018/050403, filed on Jan. 9, 2018.

(30) Foreign Application Priority Data

Jan. 17, 2017 (DE) ...................... 10 2017 200 667.6

(51) Int. Cl.
*G03F 7/20* (2006.01)
*G02B 5/08* (2006.01)
*G02B 27/00* (2006.01)

(52) U.S. Cl.
CPC ......... *G02B 5/0891* (2013.01); *G02B 5/0875* (2013.01); *G03F 7/70908* (2013.01);
(Continued)

(58) Field of Classification Search
CPC . G02B 5/0891; G02B 5/0875; G03F 7/70908; G03F 7/70958; G03F 7/70033
(Continued)

(56) References Cited

U.S. PATENT DOCUMENTS 10,331,048 B2 6/2019 Dier et al.
2010/0033702 A1* 2/2010 Rigato ................ G03F 7/70166
355/67
(Continued)

FOREIGN PATENT DOCUMENTS

DE 102009054653 A1 6/2011
DE 102011075579 A1 11/2012
(Continued)

OTHER PUBLICATIONS

GPTO Office Action with English translation, German Application No. 102017200667, dated Sep. 13, 2017, 14 pages.
(Continued)

*Primary Examiner* — Hung Nguyen
(74) *Attorney, Agent, or Firm* — Edell, Shapiro & Finnan, LLC

(57) ABSTRACT

A mirror, in particular for a microlithographic projection exposure apparatus or an inspection system, having a mirror substrate (205), a reflection layer (220), which is configured to have a reflectivity of at least 50% for electromagnetic radiation of a predefined operating wavelength that is incident on the optically effective surface (200a) of the mirror at an angle of incidence of at least 65° relative to the respective surface normal, and a barrier layer system (210), which is arranged between the reflection layer and the mirror substrate and has a sequence of alternating layer plies composed of a first material and at least one second material. The barrier layer system reduces penetration of hydrogen atoms that would otherwise penetrate the mirror substrate by at least a factor of 10.

26 Claims, 2 Drawing Sheets

(52) U.S. Cl.
CPC ...... *G03F 7/70958* (2013.01); *G02B 27/0006* (2013.01); *G03F 7/70691* (2013.01)

(58) Field of Classification Search
USPC .......................................... 359/350; 355/67
See application file for complete search history.

(56) References Cited

U.S. PATENT DOCUMENTS

| | | | |
|---|---|---|---|
| 2010/0190113 A1* | 7/2010 | Murakami | G02B 5/0891 430/322 |
| 2013/0038929 A1 | 2/2013 | Muellender et al. | |
| 2014/0022525 A1 | 1/2014 | Enkisch et al. | |
| 2014/0098413 A1 | 4/2014 | Ershov et al. | |
| 2014/0193591 A1 | 7/2014 | Kuznetzov et al. | |
| 2015/0009480 A1 | 1/2015 | Shklover | |
| 2016/0012929 A1* | 1/2016 | Kuznetsov | B82Y 10/00 250/505.1 |
| 2016/0187543 A1* | 6/2016 | Bekman | G02B 5/0891 359/360 |
| 2017/0160639 A1 | 6/2017 | Ehm et al. | |
| 2019/0171108 A1 | 6/2019 | Ehm et al. | |

FOREIGN PATENT DOCUMENTS

| | | |
|---|---|---|
| DE | 102011077983 A1 | 12/2012 |
| DE | 102012202675 A1 | 1/2013 |
| DE | 102013102670 A1 | 2/2014 |
| DE | 102014222534 A1 | 11/2015 |
| DE | 102014216240 A1 | 2/2016 |
| DE | 102015226014 A1 | 3/2016 |
| DE | 102015213253 A1 | 1/2017 |
| EP | 2824487 A1 | 1/2015 |
| EP | 2905637 A1 | 8/2015 |
| WO | 2012136420 A1 | 10/2012 |
| WO | 2017207264 A1 | 12/2017 |

OTHER PUBLICATIONS

Terreault, "Hydrogen blistering of silicon: Progress in fundamental understand", phy. stat. sol. (a) 204, No. 7, (2007) pp. 2129-2184.
"Research Disclosure", Kenneth Mason Publications, May 1, 2014, 8 pages.
International Preliminary Report on Patentability, PCT/EP2018/050403, dated Jul. 23, 2019, 34 pages.
Cizek et al., "Hydrogen-induced defects in bulk niobium", Physical Review B 69, 224106 (2004), 13 pages.
Pundt, "Hydrogen in Nano-sized Metals", Advanced Engineering Materials, (2004), 6, No. 1-2, 11 pages.
International Preliminary Report on Patentability and Written Opinion, PCT/EP2018/050403, dated Jul. 23, 2019, 17 pages.
Research Disclosure Kenneth Mason Publications, vol. 601, No. 65, May 1, 2014, 8 pages.
International Search Report, PCT/EP2018/050403, completion date Apr. 13, 2018, 6 pages.
Magnus Hamm, "Hydrogen diffusion and hydride formation in grain boundary rich magnesium", 2018, cover page and pp. 135-138.

* cited by examiner

MIRROR, IN PARTICULAR FOR A MICROLITHOGRAPHIC PROJECTION EXPOSURE APPARATUS OR AN INSPECTION SYSTEM

This is a Continuation of International Application PCT/EP2018/050403, which has an international filing date of Jan. 9, 2018, and the disclosure of which is incorporated in its entirety into the present Continuation by reference. This Continuation also claims foreign priority under 35 U.S.C. § 119(a)-(d) to German Patent Application DE 10 2017 200 667.6 filed on Jan. 17, 2017. The entire contents of this priority application are also incorporated into the present Continuation by reference.

FIELD OF THE INVENTION

The invention relates to a mirror, in particular for a microlithographic projection exposure apparatus or an inspection system.

BACKGROUND

Microlithography is used for producing microstructured components, such as for example integrated circuits or LCDs. The microlithography process is carried out in what is called a projection exposure apparatus, which comprises an illumination device and a projection lens. The image of a mask (=reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

Further optical systems used in microlithography also comprise inspection systems e.g. in the form of a mask inspection system (for inspecting reticles, or masks, for use in a projection exposure apparatus) or of a wafer inspection system (for observing and testing wafer surfaces).

In projection lenses designed for the EUV range, e.g. at wavelengths of e.g. approximately 13 nm or approximately 7 nm, owing to the lack of availability of suitable light-transmissive refractive materials, mirrors are used as optical components for the imaging process.

Inter alia, the operation of grazing incidence mirrors is known here. Here and hereinafter, such mirrors operated with grazing incidence are understood to mean mirrors for which the angles of reflection relative to the respective surface normal, which occur during the reflection of the EUV radiation, are at least 65°. Such mirrors are sometimes also referred to in short as GI mirrors ("grazing incidence"). In principle, the use of such GI mirrors is desirable, inter alia in view of the comparatively high achievable reflectivities (of e.g. 80% or more). In contrast for instance to normal incidence mirrors (also referred to as NI mirrors ("normal incidence")), such GI mirrors, for obtaining the respective reflectivities, require as a reflection layer just a single layer, which may consist of ruthenium (Ru), for example, and may have e.g. a typical layer thickness in the region of 40 nm, rather than a multilayer system in the form of a sequence of numerous alternating individual layers composed of at least two different layer materials.

In order to avoid, during operation of a projection exposure apparatus, inter alia a loss of reflection of the reflective optical components as a consequence of contaminants entering the respective optical system, it is known to charge the immediate surroundings of the relevant reflective optical components with an atmosphere of for example hydrogen (as "purge gas"), which prevents ingress of unwanted contaminants into the optical system into the immediate surroundings of these reflective optical components.

In this case, however, in practice the problem can arise that this (ionic or atomic) hydrogen can penetrate into the reflection layer system present on the substrate of the reflective optical components (i.e. in particular into the abovementioned single layer composed e.g. of ruthenium (Ru) of a GI mirror) and, by way of an enrichment of gas phases, can ultimately lead to layer detachment and thus to a loss of reflectivity or even destruction of the reflective optical element.

In the case of a GI mirror, this problem may be particularly serious insofar as the reflection layer system (which as described above typically consists just of a single layer composed of e.g. ruthenium (Ru), niobium (Nb) or molybdenum (Mo)), in contrast to a multilayer system of an NI mirror, does not itself provide any interfaces impeding the diffusion of the hydrogen atoms between successive layers, with the consequence that the hydrogen can pass substantially unhindered as far as the substrate surface, where it can lead to delamination by way of blistering.

In relation to the prior art, reference is made merely by way of example to DE 10 2014 216 240 A1, DE 10 2014 222 534 A1, DE 10 2013 102 670 A1, DE 10 2011 077 983 A1, WO 2012/136420 A1 and EP 2 905 637 A1.

SUMMARY

Against the background above, it is an object of the present invention to provide a mirror, in particular for a microlithographic projection exposure apparatus or an inspection system, which is designed for grazing incidence operation and in which an impairment of the reflection properties or destruction of the mirror by hydrogen that has accumulated during operation of the optical system is avoided to an extent as great as possible.

In accordance with one aspect of the invention, a mirror, in particular for a microlithographic projection exposure apparatus or an inspection system, comprises an optically effective surface, and:

a mirror substrate,
  a reflection layer, which is configured such that the mirror has a reflectivity of at least 50% for electromagnetic radiation of a predefined operating wavelength that is incident on the optically effective surface at an angle of incidence of at least 65° relative to the respective surface normal, and
  a barrier layer system, which is arranged between the reflection layer and the mirror substrate and comprises a sequence of alternating layer plies composed of a first material and at least one second material, wherein the barrier layer system reduces penetration of hydrogen atoms as far as the mirror substrate by at least a factor of 10 in comparison with an analogous construction without the barrier layer system.

The invention is based on the concept, in particular, in a mirror designed for grazing incidence operation, of eliminating or alleviating the problem described in the introduction, namely that of blistering as a result of hydrogen penetrating into a mirror designed for grazing incidence operation, by arranging between the reflection layer (which itself is typically not designed as a multilayer system) and the mirror substrate a barrier layer system having an a sequence of alternating layer plies composed of at least two different materials.

Here the invention firstly proceeds from the consideration that in a GI mirror (which, as described in the introduction, typically does not comprise a periodic multilayer system and can be constructed e.g. from a reflection layer embodied as a single layer and a mirror substrate or can comprise, if appropriate, just a few further layers such as a cap and/or growth layer) the interface between reflection layer and mirror substrate constitutes a significant weak point with regard to the risk of delamination or layer detachment as a result of blistering, for instance, since in the course of the manufacturing process the mirror substrate surface is typically the most likely to be subjected to possible deposits or contaminants (e.g. in the form of a film of water, deposition of hydrocarbons, etc.).

Proceeding from this consideration, the invention now pursues the concept of indeed allowing the hydrogen to penetrate into the reflection layer, but then preventing as efficiently as possible the hydrogen from penetrating through to the mirror substrate surface.

In order to obtain as efficient blocking of the hydrogen as possible, the invention now includes the further concept of using a barrier layer system having an a sequence of alternating layer plies composed of at least two different materials, instead of a comparatively thick single blocking layer or single barrier layer. This configuration of the barrier layer system as a sequence of multilayered alternating (in particular periodic) layers now proves to be advantageous for a number of reasons, where mention should firstly be made of the provision—obtained as a result of the multi-layered configuration—of a comparatively large number of interfaces which, by their nature, impede particularly efficiently any undesired through-diffusion of, in particular, said hydrogen atoms.

An additional factor is that the configuration of the barrier layer system as a sequence of alternating individual layer plies affords the possibility of making the relevant layer plies particularly thin (e.g. with a layer thickness in the range of (2-3) nm) in comparison with a single layer, for instance, with the consequence that crystalline growth of said layer plies is terminated at the respective interfaces. An amorphous structure of the individual layer plies can thus be achieved to a comparatively high degree, which, in comparison with polycrystalline structures (which typically provide good diffusion paths at the grain boundaries present), for instance, likewise has a positive effect on the barrier or blocking effect ultimately obtained with regard to the hydrogen atoms.

A further advantage of the configuration according to the invention of the barrier layer system as a sequence of alternating layer plies composed of at least two different materials is that given a suitable selection of the relevant materials and layer thicknesses, as it were a dual or multiple function of this layer system can be obtained inasmuch as further functionalities—typically likewise obtainable by a multilayer system—can likewise be performed by the barrier layer system. In particular, as explained in even greater detail below, the barrier layer system can additionally also function as a layer stress reducing layer and/or as a substrate protection layer.

The invention is not restricted to a configuration of the barrier layer system as a sequence composed of exactly two different materials arranged alternatingly, such that in further embodiments three or more layer plies each composed of different materials (which each by themselves form a structural unit and as such can in turn be repeated so as to alternate) are also usable. However, the restriction to two different materials may prove to be advantageous from a production engineering standpoint insofar as the number of materials to be applied within the coating apparatus, typically through sputtering, can then be restricted to a minimum.

The mirror according to the invention can be a mirror within the illumination device, a mirror within the projection lens (which likewise comprises GI mirrors depending on the design type) or else a collector mirror designed for grazing incidence operation within the plasma light source of a microlithographic projection exposure apparatus designed for operation in the EUV.

In accordance with one embodiment, the layer plies have a thickness of a maximum of 5 nm.

In accordance with one embodiment, the layer plies have an amorphous structure.

In accordance with one embodiment, the first material and/or the second material comprise(s) a material from the group containing tin (Sn), silver (Ag), molybdenum (Mo), tungsten (W), gold (Au), platinum (Pt), antimony (Sb), nickel (Ni), iron (Fe), cobalt (Co), chromium (Cr), vanadium (V), copper (Cu), aluminum (Al), zinc (Zn), manganese (Mn), lead (Pb), silicon (Si), oxides, borides, nitrides and carbides thereof, and boron carbide ($B_4C$).

In accordance with one embodiment, the barrier layer system is formed by a multilayer system. Said multilayer system can comprise in particular a periodic multilayer system, in particular a periodic multilayer system having at least five periods.

In accordance with one embodiment, the mirror comprises a substrate protection layer having a transmission of less than 0.01%, in particular less than 0.001%, for EUV radiation.

In accordance with one embodiment, the substrate protection layer comprises a material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

In accordance with one embodiment, the substrate protection layer is formed by a multilayer system. Said multilayer system can comprise in particular a periodic multilayer system, in particular a periodic multilayer system having at least five periods.

In accordance with one embodiment, the substrate protection layer is formed by the barrier layer system.

In accordance with one embodiment, the mirror comprises a layer stress compensation layer.

In accordance with one embodiment, the layer stress compensation layer comprises a material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

In accordance with one embodiment, the layer stress compensation layer is formed by a multilayer system. Said multilayer system can comprise in particular a periodic multilayer system, in particular a periodic multilayer system having at least five periods.

In accordance with one embodiment, said layer stress compensation layer is formed by the barrier layer system.

In accordance with one embodiment, the barrier layer system comprises one or more layer plies composed of a material that reduces the surface roughness in relation to the roughness of the mirror substrate.

In accordance with one embodiment, the reflection layer has a thickness of at least 10 nm.

In accordance with one embodiment, the reflection layer comprises at least one material from the group containing ruthenium (Ru), rhodium (Rh), palladium (Pd), gold (Au), platinum (Pt), niobium (Nb), molybdenum (Mo) and zirconium (Zr).

In accordance with one embodiment, the mirror comprises a cap layer arranged above the reflection layer in the direction of the optically effective surface.

In accordance with one embodiment, the operating wavelength is less than 30 nm, wherein it can be in particular in the range of 10 nm to 15 nm.

In accordance with one embodiment, the reflection layer is configured as a monolayer.

The invention furthermore relates to an optical system of a microlithographic projection exposure apparatus, and to an inspection system, which comprise at least one mirror having the features described above.

In accordance with one embodiment, said mirror is arranged in the optical system such that the angles of reflection relative to the respective surface normal, which occur during operation of the optical system upon reflection of electromagnetic radiation at the mirror, are at least 50°, in particular at least 65°.

The invention furthermore also relates to a microlithographic projection exposure apparatus comprising an illumination device and a projection lens, wherein the illumination device, during the operation of the projection exposure apparatus, illuminates a mask situated in an object plane of the projection lens, and the projection lens images structures on said mask onto a light-sensitive layer situated in an image plane of the projection lens, wherein the projection exposure apparatus comprises an optical system having the features described above.

Further configurations of the invention can be gathered from the description and the dependent claims.

The invention is explained in greater detail below on the basis of exemplary embodiments that are illustrated in the accompanying figures.

DETAILED DESCRIPTION

Figure 1:
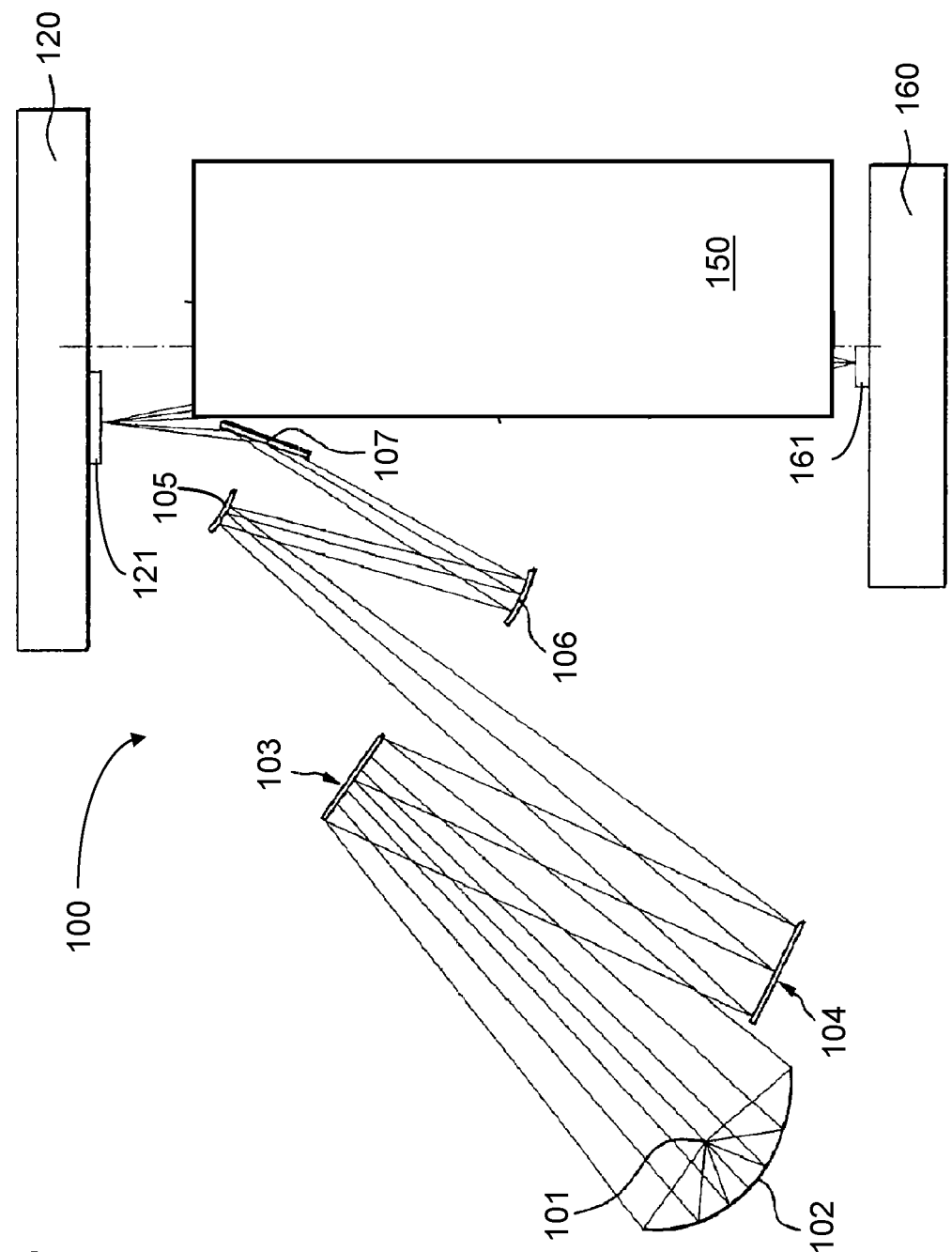
FIG. 1 shows a schematic illustration of a projection exposure apparatus designed for operation in the EUV.

FIG. 1 shows a schematic illustration of an exemplary projection exposure apparatus 100 which is designed for operation in the EUV and in which the present invention can be realized.

According to FIG. 1, an illumination device of the projection exposure apparatus 100 comprises a field facet mirror 103 and a pupil facet mirror 104. The light from a light source unit comprising a plasma light source 101 and a collector mirror 102 is directed onto the field facet mirror 103. A first telescope mirror 105 and a second telescope mirror 106 are arranged in the light path downstream of the pupil facet mirror 104. A deflection mirror 107 operated with grazing incidence is arranged downstream in the light path and directs the radiation impinging on it onto an object field in the object plane of a projection lens, which is merely indicated in FIG. 1. At the location of the object field, a reflective structure-bearing mask 121 is arranged on a mask stage 120, said mask being imaged with the aid of a projection lens 150 into an image plane in which a substrate 161 coated with a light-sensitive layer (photoresist) is situated on a wafer stage 160.

The construction according to the invention of a mirror operated with grazing incidence can be realized for example in the case of one or more mirrors of the projection lens 150 or else in the case of the deflection mirror 107 provided within the illumination device.

The invention is realizable, in particular in an advantageous manner, in a projection lens which comprises at least one mirror for grazing incidence of the illumination light (with angles of incidence greater than 65°), for example in a projection lens as shown in DE 10 2012 202 675 A1. In further exemplary embodiments, the invention can also be realised in projection lenses having a different construction or in other optical systems. Furthermore, the invention can also be realized in a plasma light source of a projection exposure apparatus designed for operation in the EUV, wherein for instance a collector mirror designed for grazing incidence can be configured according to the invention.

Possible embodiments of a mirror operated with grazing incidence in accordance with the present invention are described below with reference to the schematic depiction in FIG. 2.

Figure 2:
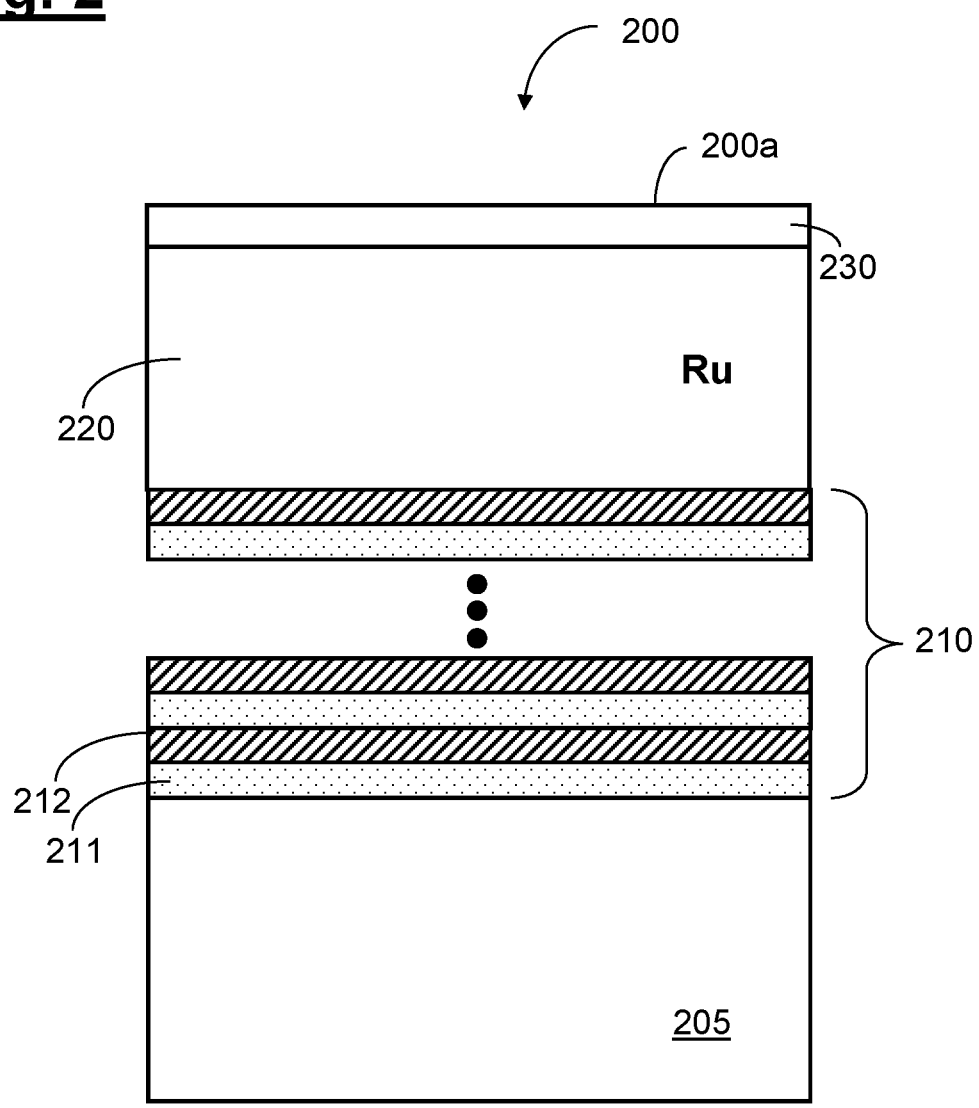
FIG. 2 shows a schematic illustration for illustrating the possible construction of a mirror in one exemplary embodiment of the invention.

In accordance with FIG. 2, in a first embodiment, a mirror 200 designed for operation with grazing incidence can have, in a manner known per se, a mirror substrate 205 (which can be produced from any suitable substrate material, e.g. from silicon or from a titanium silicate glass sold under the trademark ULE® by Corning Inc.) and a reflection layer 220, which, in the exemplary embodiment, is produced from ruthenium (Ru) and can have a typical exemplary thickness in the range of 20 nm to 200 nm. In further embodiments, use likewise can be made of layer systems, known per se, for GI mirrors with more than a single (e.g. ruthenium (Ru)) layer. "230" denotes a cap layer provided on the reflection layer 220, and "200a" denotes the optically effective surface.

In respect of exemplary possible layer designs of GI mirrors, reference is made to e.g. DE 10 2011 075 579 A1.

In order to avoid undesired delamination or partial destruction of the mirror as a result of blistering upon the ingress of hydrogen, the mirror 200 comprises a barrier layer system 210, which is arranged between the reflection layer 220 and the mirror substrate 205 directly on the mirror substrate surface and comprises a sequence of alternating layer plies 211 composed of a first material and layer plies 212 composed of a second material.

In the specific exemplary embodiment, the first material is molybdenum (Mo) and the second material is silicon (Si). In further embodiments, other materials such as e.g. aluminum (Al), copper (Cu), silver (Ag) or chromium (Cr) can also be used and correspondingly combined to form an alternating sequence. Furthermore, in embodiments of the invention, use can also be made of more than two layer plies each composed of different materials, which then each form a structural unit that is correspondingly repeated in the alternating sequence.

The thickness of the individual plies is preferably a maximum of 5 nm and can be in the range of 2-3 nm, in particular. Comparatively small layer thicknesses of this type advantageously lead to a termination of the crystalline growth for the individual layer plies and thus to an improved blocking effect (for instance in comparison with polycrystalline structures), since the layer plies then have an amorphous structure to a comparatively high degree.

The total number of alternating layer plies in the sequence within the barrier layer system 210, merely by way of example (and without the invention being restricted thereto), can be in the range of 10 to 40.

In further embodiments, the barrier layer system 210 according to the invention can also have further functionalities, wherein the above-described construction as a sequence of alternating layer plies composed of different materials can advantageously be utilized further.

In this regard, in particular, the barrier layer system 210 can also serve to protect the mirror substrate 205 against electromagnetic radiation which, during operation of the mirror 200, is incident on the optically effective surface 200a and penetrates through the reflection layer 220 owing to transmission e.g. through the ruthenium (Ru) layer, and can thus constitute as it were a substrate protection layer.

Furthermore, the barrier layer system can also serve to reduce or compensate for any undesired mechanical layer stress possibly present in the entire layer construction of the mirror 200. Such a layer stress (which may be present in the form of compressive stress or tensile stress, depending on the specific embodiment of the reflection layer of the GI mirror) may lead to a deformation of the mirror substrate and hence to unwanted changes in the wavefront during the operation of the respective optical system if no further measures are taken.

In further embodiments of the invention, the mirror according to the invention can also be configured such that one or both of the above-described functionalities (i.e. substrate protection and/or layer stress reduction) is/are fulfilled by a layer system embodied separately from the barrier layer system 210.

Furthermore, the barrier layer system can also comprise one or more layer plies composed of a material that reduces the surface roughness in relation to the roughness of the mirror substrate.

Even though the invention has been described on the basis of specific embodiments, numerous variations and alternative embodiments are apparent to a person skilled in the art, for example by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. A mirror configured for a microlithographic projection exposure apparatus or an inspection system and having an optically effective surface, comprising:
    a mirror substrate;
    a reflection layer, which is configured as a monolayer, wherein the reflection layer has a reflectivity of at least 50% for electromagnetic radiation of a predefined operating wavelength that is incident on the optically effective surface at an angle of incidence of at least 65° relative to a respective surface normal on the optically effective surface; and
    a barrier layer system, which is arranged between the reflection layer and the mirror substrate and comprises a sequence of alternating layer plies composed of a first material and at least one second material, wherein the barrier layer system is configured to reduce penetration of hydrogen atoms into the mirror substrate by at least a factor of 10 in comparison to the reflection layer without the barrier layer system.

2. The mirror as claimed in claim 1, wherein the layer plies have a thickness of maximally 5 nm.

3. The mirror as claimed in claim 1, wherein the layer plies have an amorphous structure.

4. The mirror as claimed in claim 1, wherein the first material and/or the second material comprise(s) a material from the group containing tin (Sn), silver (Ag), molybdenum (Mo), tungsten (W), gold (Au), platinum (Pt), antimony (Sb), nickel (Ni), iron (Fe), cobalt (Co), chromium (Cr), vanadium (V), copper (Cu), aluminum (Al), zinc (Zn), manganese (Mn), lead (Pb), silicon (Si), oxides, borides, nitrides and carbides thereof, and boron carbide ($B_4C$).

5. The mirror as claimed in claim 1, wherein the barrier layer system comprises a periodic multilayer system.

6. The mirror as claimed in claim 1, further comprising a substrate protection layer having a transmission of less than 0.01% for extreme ultraviolet (EUV) radiation.

7. The mirror as claimed in claim 6, wherein the substrate protection layer comprises a material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

8. The mirror as claimed in claim 6, wherein the substrate protection layer is a multilayer system.

9. The mirror as claimed in a claim 8, wherein the multilayer system comprises a periodic multilayer system.

10. The mirror as claimed in claim 1, wherein the barrier layer system comprises a substrate protection layer.

11. The mirror as claimed in claim 1, further comprising a layer stress compensation layer.

12. The mirror as claimed in claim 11, therein the layer stress compensation layer comprises a material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

13. The mirror as claimed in claim 11, wherein the layer stress compensation layer is a multilayer system.

14. The mirror as claimed in claim 13, wherein the multilayer system is a periodic multilayer system.

15. The mirror as claimed in claim 1, wherein the barrier layer system comprises a layer stress compensation layer.

16. The mirror as claimed in claim 1, wherein the layer plies of the barrier layer system comprise at least one layer ply composed of a material that reduces a surface roughness in relation to a roughness of the mirror substrate.

17. The mirror as claimed in claim 1, wherein the reflection layer has a thickness of at least 10 nm.

18. The mirror as claimed in claim 1, wherein the reflection layer comprises at least one material from the group containing ruthenium (Ru), rhodium (Rh), palladium (Pd), gold (Au), platinum (Pt), niobium (Nb), molybdenum (Mo) and zirconium (Zr).

19. The mirror as claimed in claim 1, further comprising a cap layer arranged above the reflection layer in a direction of the optically effective surface.

20. The mirror as claimed in claim 1, wherein the operating wavelength is less than 30 nm.

21. An optical system of a microlithographic projection exposure apparatus, comprising a mirror as claimed in claim 1.

22. The optical system as claimed in claim 21, wherein the mirror is arranged in the optical system such that angles of reflection relative to the respective surface normal, which occur during operation of the optical system upon reflection of electromagnetic radiation at the mirror, are at least 50°.

23. An inspection system, comprising a mirror as claimed in claim 1.

24. The inspection system as claimed in claim 23, wherein the mirror is arranged such that the angles of reflection relative to the respective surface normal, which occur during operation of the inspection system upon reflection of electromagnetic radiation at the mirror, are at least 50°.

25. A microlithographic projection exposure apparatus comprising an illumination device and a projection lens, wherein the illumination device, during operation of the projection exposure apparatus, illuminates a mask situated in an object plane of the projection lens, and the projection lens images structures on the mask onto a light-sensitive layer situated in an image plane of the projection lens, wherein the projection exposure apparatus comprises at least one mirror as claimed in claim 1.

26. A mirror configured for a microlithographic projection exposure apparatus or an inspection system and having an optically effective surface, comprising:
- a mirror substrate;
- a reflection layer system consisting essentially of a monolayer having a reflectivity of at least 50% for electromagnetic radiation of a predefined operating wavelength that is incident on the optically effective surface at an angle of incidence of at least 65° relative to a respective surface normal on the optically effective surface; and
- a barrier layer system, which is arranged between the reflection layer and the mirror substrate and comprises a sequence of alternating layer plies composed of a first material and at least one second material, wherein the barrier layer system is configured to reduce penetration of hydrogen atoms into the mirror substrate by at least a factor of 10 in comparison to the reflection layer without the barrier layer system.

\* \* \* \* \*

UNITED STATES PATENT AND TRADEMARK OFFICE
CERTIFICATE OF CORRECTION

| | |
|---|---|
| PATENT NO. | : 11,086,055 B2 |
| APPLICATION NO. | : 16/514006 |
| DATED | : August 10, 2021 |
| INVENTOR(S) | : Huber |

Page 1 of 1

It is certified that error appears in the above-identified patent and that said Letters Patent is hereby corrected as shown below:

In the Specification

Column 2, Line 65, After "having" delete "an".

Column 3, Line 22, After "having" delete "an".

Signed and Sealed this
Twenty-first Day of December, 2021

Drew Hirshfeld
*Performing the Functions and Duties of the
Under Secretary of Commerce for Intellectual Property and
Director of the United States Patent and Trademark Office*